(12) United States Patent
Chasmawala et al.

(10) Patent No.: US 8,260,213 B2
(45) Date of Patent: Sep. 4, 2012

(54) METHOD AND APPARATUS TO ADJUST A TUNABLE REACTIVE ELEMENT

(75) Inventors: Shamsuddin H. Chasmawala, Middletown, CT (US); Matthew R. Greene, Crystal Lake, IL (US)

(73) Assignee: Research In Motion RF, Inc, Wilmington, DE (US)

( * ) Notice: Subject to any disclaimer, the term of this patent is extended or adjusted under 35 U.S.C. 154(b) by 414 days.

(21) Appl. No.: 12/560,115

(22) Filed: Sep. 15, 2009

(65) Prior Publication Data

US 2010/0069029 A1   Mar. 18, 2010

Related U.S. Application Data

(60) Provisional application No. 61/192,091, filed on Sep. 15, 2008.

(51) Int. Cl.
| | |
|---|---|
| H04B 1/40 | (2006.01) |
| H04B 1/04 | (2006.01) |
| H04B 1/16 | (2006.01) |
| H04B 1/18 | (2006.01) |
| H01Q 11/12 | (2006.01) |

(52) U.S. Cl. ......... 455/77; 455/87; 455/120; 455/178.1; 455/184.1; 455/193.1; 455/195.1

(58) Field of Classification Search .............. 455/83, 455/87, 120–125, 129, 178.1, 180.4, 191.1–191.2, 455/193.1–193.3, 195, 197.2–197.3, 77, 455/184.1, 195.1
See application file for complete search history.

(56) References Cited

U.S. PATENT DOCUMENTS

| | | | | |
|---|---|---|---|---|
| 4,365,119 | A * | 12/1982 | Chung et al. | 379/406.06 |
| 5,589,844 | A * | 12/1996 | Belcher et al. | 343/860 |
| 6,920,315 | B1 * | 7/2005 | Wilcox et al. | 455/121 |
| 7,057,472 | B2 * | 6/2006 | Fukamachi et al. | 333/101 |
| 7,174,147 | B2 * | 2/2007 | Toncich et al. | 455/339 |
| 7,277,677 | B2 * | 10/2007 | Ida et al. | 455/78 |
| 7,512,384 | B2 * | 3/2009 | Toda et al. | 455/107 |
| 7,706,759 | B2 * | 4/2010 | Rofougaran | 455/121 |

* cited by examiner

*Primary Examiner* — Simon Nguyen
(74) *Attorney, Agent, or Firm* — Guntin Meles & Gust, PLC; Andrew Gust

(57) ABSTRACT

A system that incorporates teachings of the present disclosure may include, for example, a method involving a step to tune a plurality of tunable reactive elements by measuring a drift in reactance of at least one of the plurality of tunable reactive elements away from a desired reactance. Additional embodiments are disclosed.

32 Claims, 9 Drawing Sheets

400

700

800

900

1000

1100

METHOD AND APPARATUS TO ADJUST A TUNABLE REACTIVE ELEMENT

PRIOR APPLICATION

The present application claims the benefit of priority to U.S. Provisional Application No. 61/192,091 filed on Sep. 15, 2008, which is hereby incorporated herein by reference in its entirety.

FIELD OF THE DISCLOSURE

The present disclosure relates generally to tunable reactive elements, and more specifically to a method and apparatus to adjust a tunable reactive element.

BACKGROUND

Tunable reactive elements such a Voltage Variable Capacitors (VVCs) can be affected by a drift in reactance due to a change in temperature or residual polarization. A drift in reactance may affect a performance of a device utilizing a VVC. For example, an antenna coupled to one or more VVCs experiencing a change in reactance due to temperature or residual polarization can cause a mismatch which in turn results in a reduction in antenna performance. Other causes for a drift in reactance of a tunable reactive element can adversely affect a device's operation.

DETAILED DESCRIPTION

One embodiment of the present disclosure entails a device having a signal source coupled to a first tunable reactive element to generate a first signal, a reactance detection circuit, and an error correction circuit. The reactive detection circuit can be operable to detect from the first signal a reactance of the first tunable reactive element, and generate a second signal that represents the reactance. The error correction circuit can be operable to receive a control signal that represents a desired reactance of the first tunable reactive element, detect from a comparison of the control signal to the second signal a drift from the desired reactance, and generate a third signal to adjust the reactance of the first tunable reactive element to achieve the desired reactance.

One embodiment of the present disclosure entails a tunable matching network having a first tunable reactive element, and a second tunable reactive element. The first and second tunable reactive elements can be tuned to a desired reactance by a control signal and a device operable to adjust a reactance of the first and second tunable reactive elements when the desired reactance is not achieved.

One embodiment of the present disclosure entails a method involving steps to receive a first signal from a signal source coupled to a first tunable reactive element, produce according to the first signal a second signal representing a measure of reactance of the first tunable reactive element, receive a control signal representing a desired reactance of the first tunable reactive element, compare the second signal to the control signal to produce a difference signal, integrate the difference signal to produce a third signal, apply the third signal to the first tunable reactive element to reduce a difference between the measured reactance and the desired reactance.

One embodiment of the present disclosure entails a method involving a step to tune a tunable network of one or more reactive elements by measuring a drift in reactance of a reference reactive element away from a desired reactance.

Figure 1:
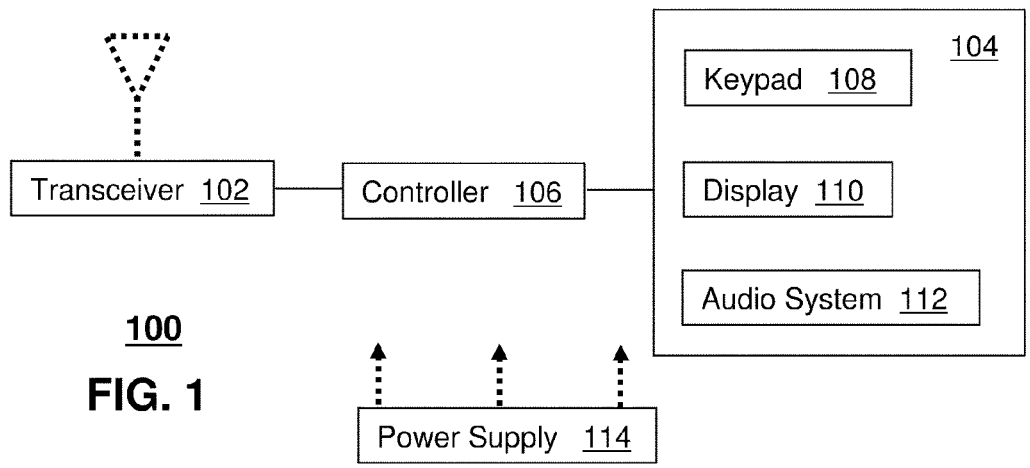
FIG. 1 depicts an illustrative embodiment of a communication device.

FIG. 1 depicts an illustrative embodiment of a communication device 100. The communication device 100 can comprise a wireless transceiver 102 (herein having independent transmit and receiver sections, a user interface (UI) 104, a power supply 114, and a controller 106 for managing operations thereof. The wireless transceiver 102 can utilize short-range or long-range wireless access technologies such as Bluetooth, WiFi, Digital Enhanced Cordless Telecommunications (DECT), or cellular communication technologies, just to mention a few. Cellular technologies can include, for example, CDMA-1X, WCDMA, UMTS/HSDPA, GSM/GPRS, TDMA/EDGE, EV/DO, WiMAX, and next generation cellular wireless communication technologies as they arise.

The UI 104 can include a depressible or touch-sensitive keypad 108 with a navigation mechanism such as a roller ball, joystick, mouse, or navigation disk for manipulating operations of the communication device 100. The keypad 108 can be an integral part of a housing assembly of the communication device 100 or an independent device operably coupled thereto by a tethered wireline interface (such as a flex cable) or a wireless interface supporting for example Bluetooth. The keypad 108 can represent a numeric dialing keypad commonly used by phones, and/or a Qwerty keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is a touch-sensitive display, a portion or all of the keypad 108 can be presented by way of the display.

The power supply 114 can utilize common power management technologies (such as replaceable batteries, supply regulation technologies, and charging system technologies) for supplying energy to the components of the communication device 100 to facilitate portable applications. The controller 106 can utilize computing technologies such as a microprocessor and/or digital signal processor (DSP) with associated storage memory such as Flash, ROM, RAM, SRAM, DRAM or other like technologies.

Figure 2:
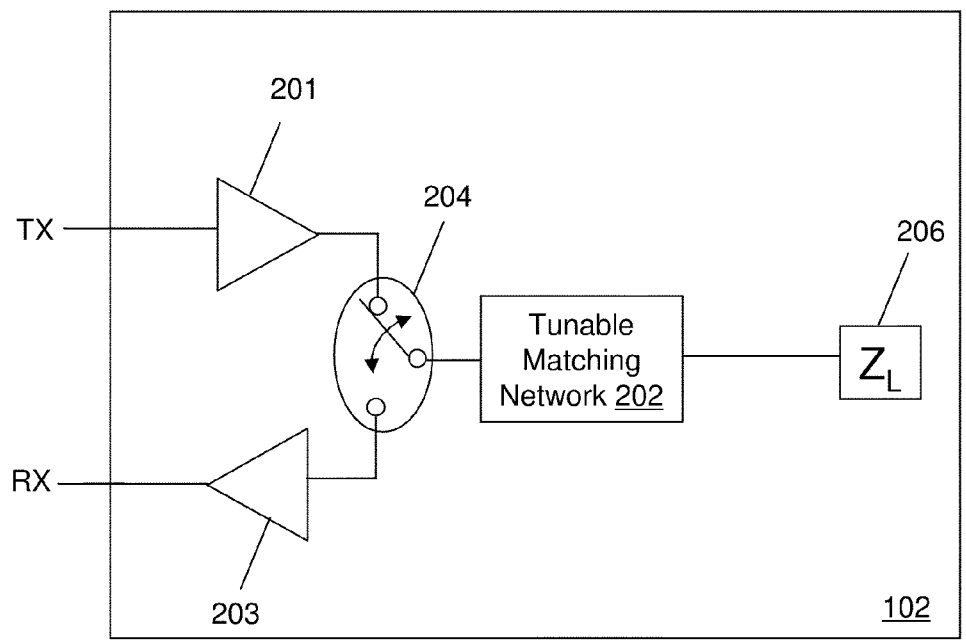
FIG. 2 depicts an illustrative embodiment of a portion of a transceiver of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include common amplifiers 201, 203 coupled to a tunable matching network 202 and an impedance load 206 by way of a switch 204. The load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA. These undisclosed configurations are contemplated by the present disclosure.

Figure 3:
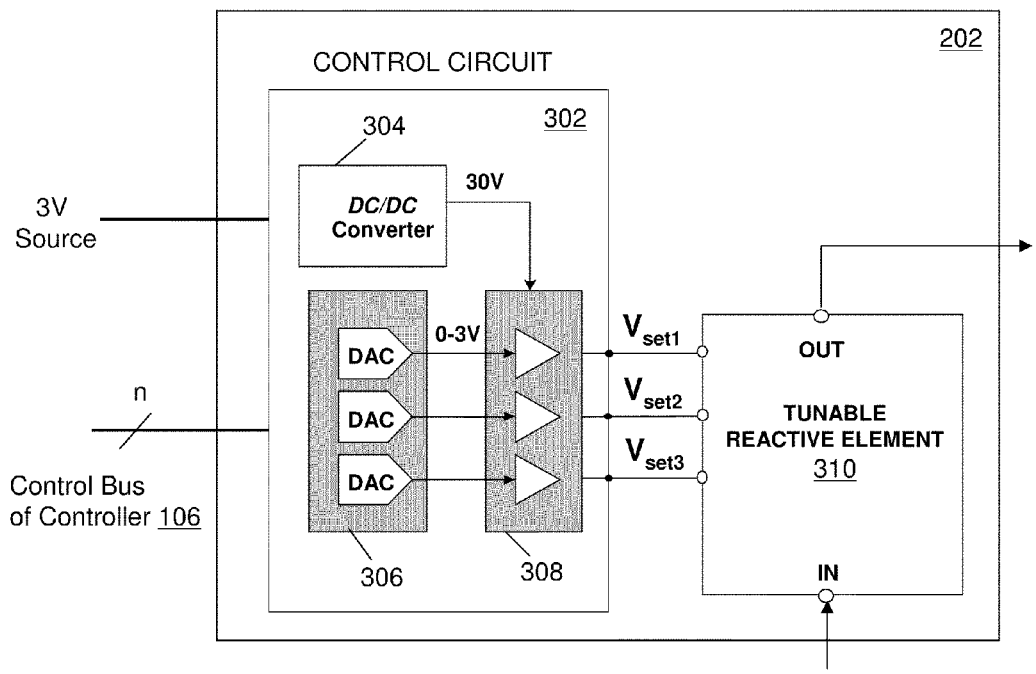
FIG. 3 depicts an illustrative embodiment of a tunable matching network of the transceiver of FIG. 2.
Figure 4:
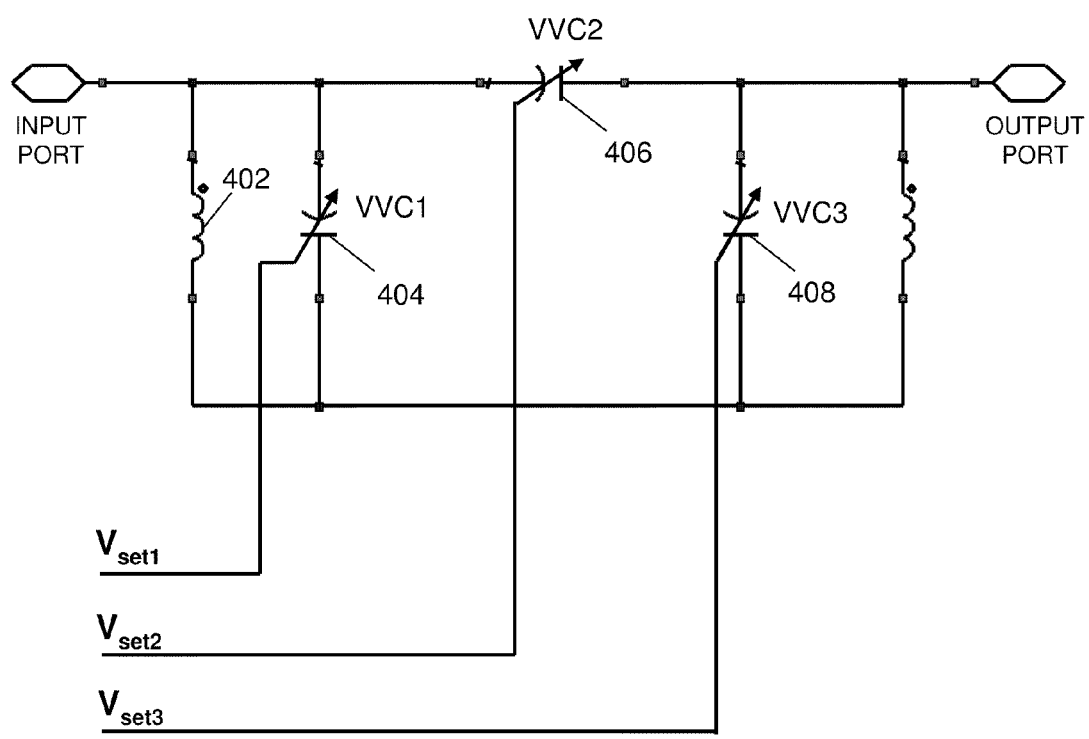
FIG. 4 depicts an illustrative embodiment of a tunable reactive element of the tunable matching network of FIG. 3.

FIG. 3 depicts an illustrative embodiment of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding amplifiers 308 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 404-408 and an inductor 402 with a fixed inductance. Other circuit configurations are possible, and thereby contemplated by the present disclosure.

The tunable capacitors 404-408 can each utilize technology that enables tunability of the capacitance of said component. In one embodiment, the tunable reactive element 310 can utilize Voltage Variable Capacitors (VVCs) with tunable dielectric constant. In another embodiment, the tunable reactive element 310 can utilize semiconductor varactors or switched reactive elements utilizing microelectromechanical systems (MEMs) switches or semiconductor switches. Other present or next generation methods or material compositions that can support a means for a voltage or current tunable reactive element (capacitive and/or inductive) are contemplated by the present disclosure. In the present illustration, however, tunable capacitors 404-408 will be assumed to be VVC1-3 controlled by amplified voltages $V_{set1}$-$V_{set3}$.

The DC-to-DC converter 304 can receive a power signal such as 3 Volts from the power supply 114 of the communication device 100 in FIG. 1. The DC-to-DC converter 304 can use common technology to amplify a DC power signal to a higher range (e.g., 30 Volts) such as shown. The controller 106 can supply digital signals to each of the DACs 306 by way of a control bus of "n" or more wires to individually control the capacitance of tunable capacitors 404-408, thereby varying the collective reactance of the tunable matching network 202. The control bus can be implemented with a two-wire common serial communications technology such as a Serial Peripheral Interface (SPI) bus. With an SPI bus, the controller 106 can submit serialized digital signals to configure each DAC in FIG. 3. The control circuit 302 of FIG. 3 can utilize common digital logic to implement the SPI bus and to direct digital signals supplied by the controller 106 to the DACs.

The tunability of the tunable matching network 202 provides the controller 106 a means to adapt performance parameters of the transceiver 102 such as, for example, but not limited to, transmitter power, transmitter efficiency, receiver sensitivity, power consumption of the communication device, a specific absorption rate (SAR) of energy by a human body, frequency band performance parameters, and so on.

Figure 5:
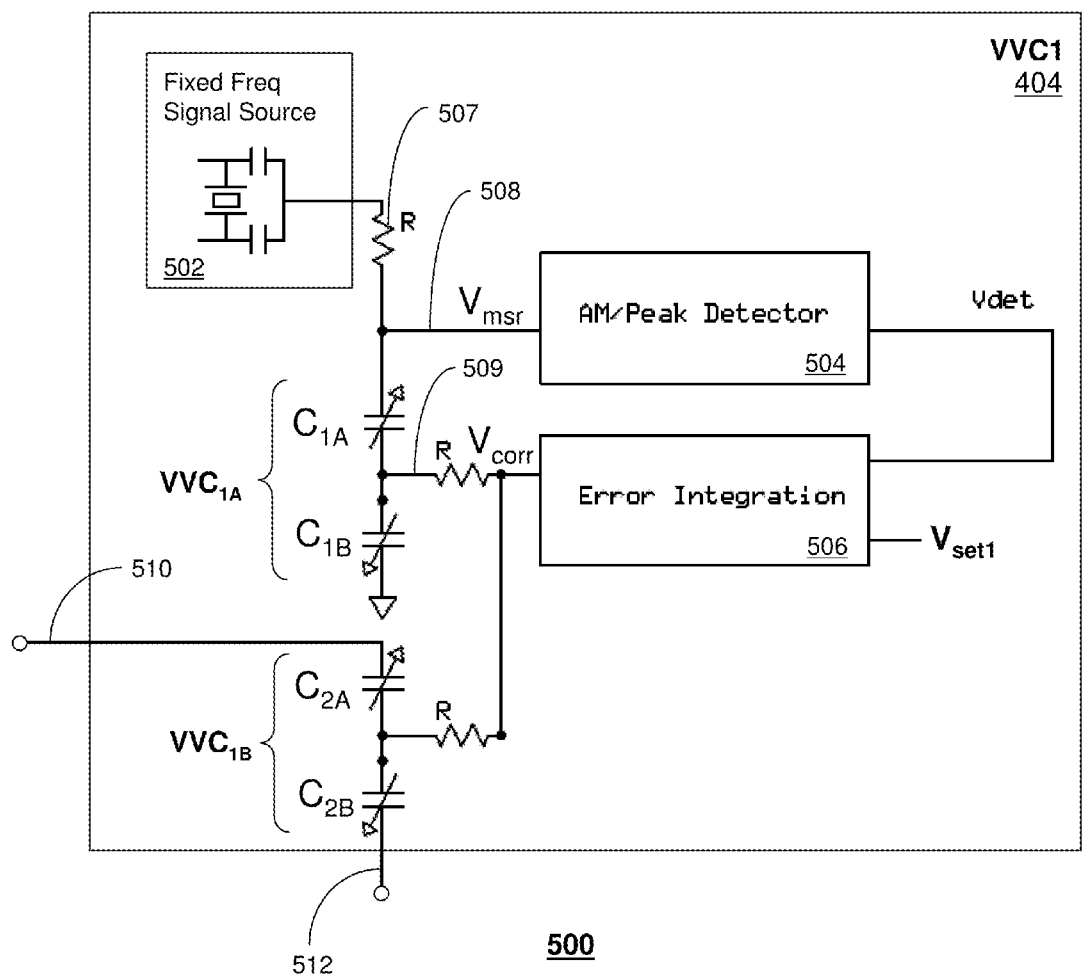
FIGS. 5-6 depict illustrative embodiments of a voltage variable capacitor of FIG. 4.
Figure 6:
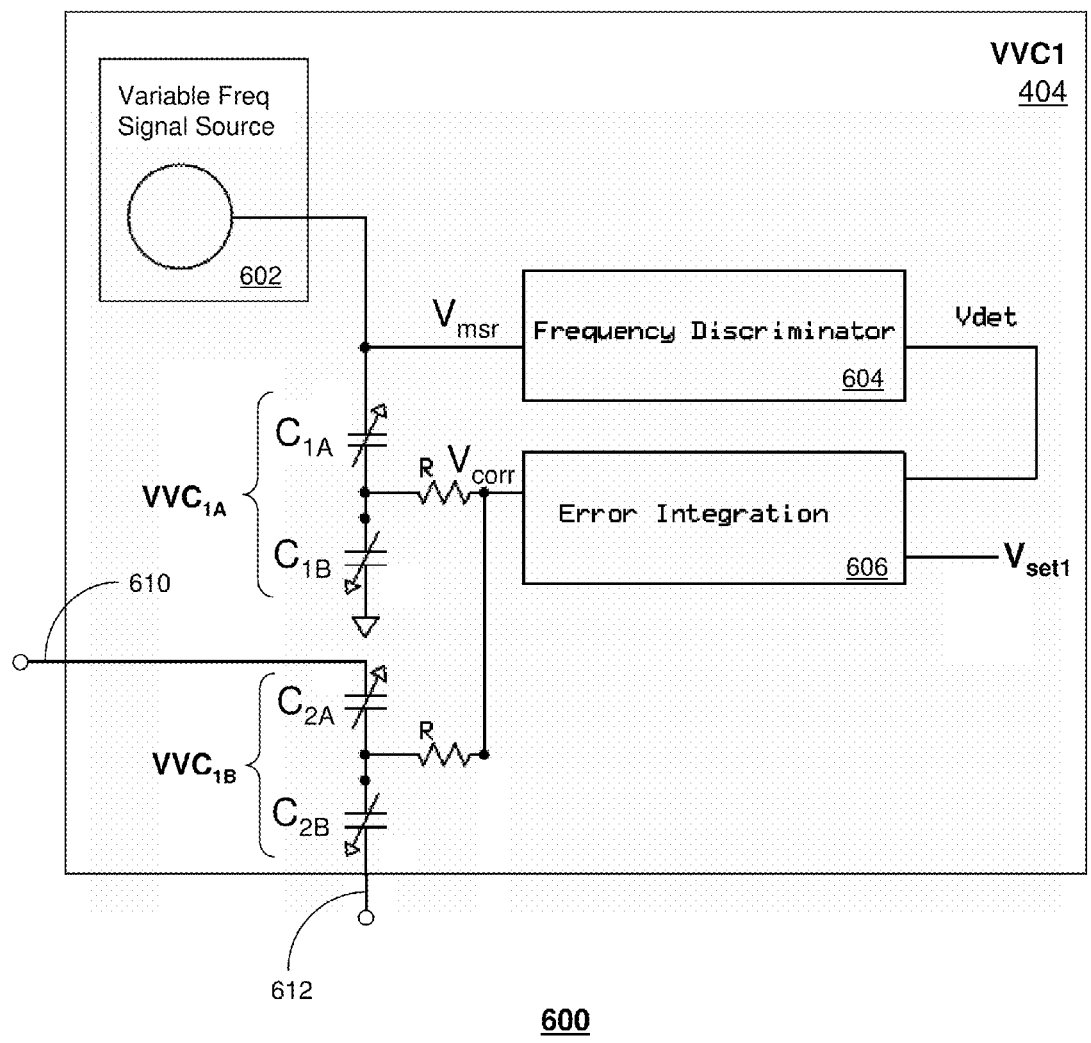

FIGS. 5-6 depict illustrative embodiments of VVC 1 depicted as reference 404 of FIG. 4. The illustration of FIGS. 5-6 can be applied to VVCs 2-3 depicted as references 406-408 in FIG. 4. Beginning with FIG. 5, VVC1 can comprise a fixed frequency signal source 502 which can be implemented with a common fixed frequency quartz crystal oscillator. The signal source 502 can be coupled to a divider circuit in the form of a precision resistor 507 (such as a thin film resistor) and $VVC_{1A}$. $VVC_{1A}$ can represent two tunable capacitors $C_{1A}$ and $C_{1B}$. Each of capacitors $C_{1A}$ and $C_{1B}$ can utilize voltage or current tunable dielectric materials such as a composition of barium strontium titanate (BST).

Figure 10:
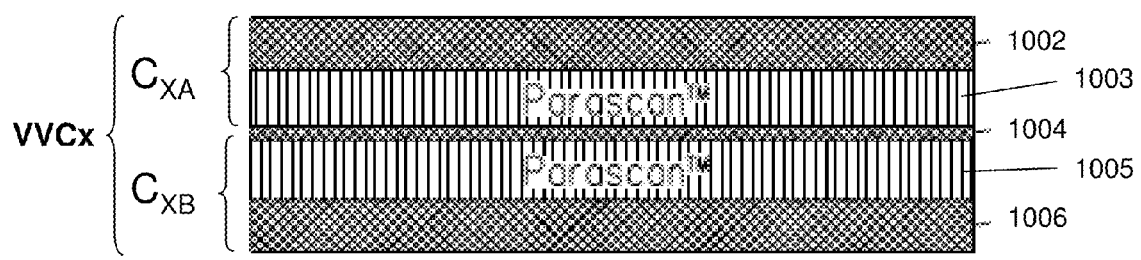
FIG. 10 depicts an illustrative embodiment of a Voltage Variable Capacitor (VVC) of FIGS. 5-6, respectively.

An illustration of a BST composition is the Parascan® Tunable Capacitor (PTC) shown in FIG. 10. In one embodiment, PTCs can be represented as two stacked capacitors $C_{XA}$ and $C_{XB}$ sharing a common electrode 1004 surrounded by outer plates 1002 and 1006. The dielectric constant of dielectric materials 1003, 1005 can be adjusted by the application of a high voltage to common electrode 1004. Collectively, capacitors $C_{XA}$ and $C_{XB}$ can represent a single Voltage Variable Capacitor (VVCx); hence, the designation of $VVC_{1A}$. The common node 509 between capacitors $C_{1A}$ and $C_{1B}$ can represent the common electrode 1004 of the PTC of FIG. 10.

Figure 7:
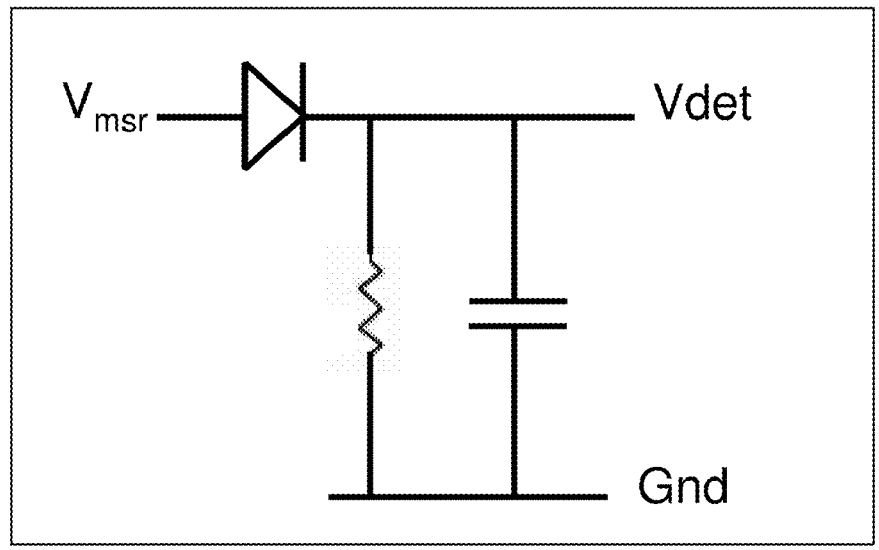
FIGS. 7-8 depict illustrative embodiments of a peak detector and frequency discriminator of FIGS. 5-6, respectively.
Figure 9:
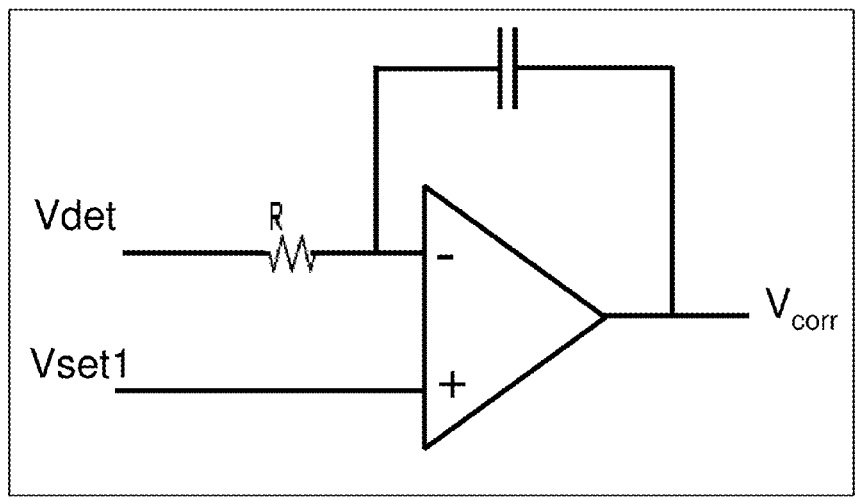
FIG. 9 depicts an illustrative embodiment of an error integration circuit of FIGS. 5-6, respectively.

The output 508 of the divider circuit generates a signal $V_{msr}$ which has an amplitude that is modulated by a change in reactance (herein capacitance) of $VVC_{1A}$. $V_{msr}$ in turn is supplied to a reactance detection circuit 504 such as an amplitude or peak detector shown by way of illustration in FIG. 7. The amplitude or peak detector can process $V_{msr}$ to produce a signal $V_{det}$ which can represent a measure of the capacitance of $VVC_{1A}$. The measure of the capacitance $V_{det}$ is supplied to an error correction circuit 506 in the form of an error integration circuit shown by way of illustration in FIG. 9. The error integration circuit can compare the measure of capacitance $V_{det}$ of tunable capacitor $VVC_{1A}$ and compare it to a control signal $V_{set1}$ corresponding to the amplified signal shown in FIGS. 3-4. The control signal represents a desirable capacitance setting of tunable capacitor $VVC_{1A}$.

An error (or difference) detected between $V_{det}$ and $V_{set1}$ is corrected by a signal $V_{corr}$ produced by the error integration circuit 506. The correction signal $V_{corr}$ can be higher or lower than $V_{set1}$ depending on the direction of drift in capacitance of tunable capacitor $VVC_{1A}$. For example, if the measured capacitance of $VVC_{1A}$ represented by $V_{det}$ is less than the desired capacitance represented by $V_{set1}$, then the correction signal $V_{corr}$ will be raised above $V_{set1}$ and vice-versa.

Drift in capacitance in a VVC can occur from a change in the operating temperature of the tunable capacitor $VVC_{1A}$ and/or a residual polarization effect inherent in $VVC_{1A}$. Tunable VVCs typically have a temperature to capacitance profile which generally results from the fabrication process used and composition of the VVC dielectric. As the operating temperature of a VVC fluctuates, the capacitance of the VVC can change according to its temperature to capacitance profile. Change in capacitance due to temperature fluctuations is generally more prominent at lower temperatures.

VVCs can also experience residual polarization which can cause a drift in the capacitance setting of a VVC. The longer a VVC is held at a particular capacitance setting, the more likely it will experience residual polarization. This phenomenon is more apparent at high capacitance settings ($V_{set1}$ at low voltages). For example, assume a VVC is set to a high capacitance for a period sufficient to experience the full effect of residual polarization. If at this point the VVC is changed to a lower capacitance ($V_{set1}$ at a higher voltage), the VVC capacitor will have a tendency to drift from its new setting to the previous higher capacitance setting due to residual polarization.

The reactance detection circuit 504 and error correction circuit 506 can collectively detect a drift in capacitance in $VVC_{1A}$ due to temperature and/or residual polarization, and adjust the capacitance of $VVC_{1A}$ to achieve the desired capacitance represented by $V_{set1}$. The error detection and correction performed by the aforementioned circuits 504, 506 will continue until the effects of temperature and/or residual polarization subside.

Since $VVC_{1A}$ is a part of the voltage divider circuit coupled to the signal source 502, it cannot be used as a variable capacitance in the circuit shown in FIG. 4. For this reason, VVC1 comprises a second tunable $VVC_{1B}$ shown in FIG. 5 having output terminals 510 and 512 which correspond to the terminals of VVC1 in FIG. 4. If $VVC_{1B}$ has similar operating properties to $VVC_{1A}$ (e.g., similar temperature to capacitance profile and/or similar residual polarization), then $VVC_{1B}$ can be tuned to the desired capacitance represented by $V_{set1}$ using the same correction signal $V_{corr}$ applied to $VVC_{1A}$. $VVC_{1B}$ can be constructed to have similar operating properties to $VVC_{1A}$ by fabricating both devices on the same integrated circuit or by sharing a fabrication process across discrete components. The signal source 502, the reactance detection 504, and/or error correction circuits 506 can be fabricated in the same integrated circuit, or can be coupled externally to the integrated circuit containing $VVC_{1B}$ and $VVC_{1A}$.

Figure 8:
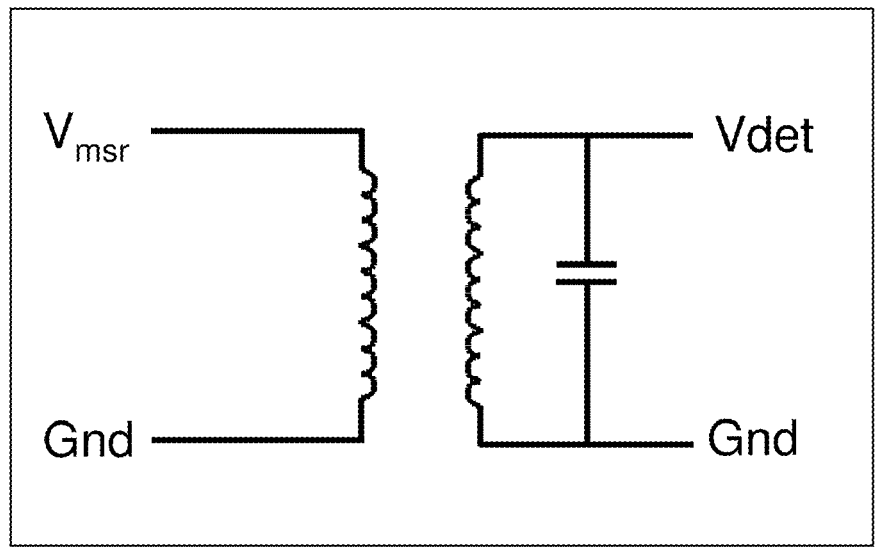

The reader is directed to FIG. 6, which presents another embodiment of VVC1. In this illustration, the signal source 502 of FIG. 5 can be replaced with a variable frequency signal source 602 such as a Voltage Controlled Oscillator (VCO). Additionally, the amplitude and/or peak detector 504 of FIG. 5 can be replaced with a frequency detector 604 in the form of a frequency discriminator such as illustrated by way of example in FIG. 8. The frequency of the VCO in this illustration is modulated by fluctuations in the capacitance of $VVC_{1A}$ to produce the signal $V_{msr}$. The frequency discriminator can detect the modulated frequency from the signal $V_{msr}$ and thereby produce a signal $V_{det}$ which it presents to the error integration circuit 606 as a measure of the capacitance of $VVC_{1A}$. The error integration circuit 606 can retune $VVC_{1A}$ when it detects a difference between the measure of capacitance of $VVC_{1A}$ represented by the signal $V_{det}$ and the control signal $V_{set1}$ supplied by the DAC and amplifier combination of FIG. 3. The output terminals of this embodiment are represented by references 610 and 612. As before $VVC_{1A}$ and $VVC_{1B}$ can be constructed so that their operating characteristics are similar and so that the correction signal $V_{corr}$ can be shared to control the desired capacitance of both tunable capacitors.

Figure 11:
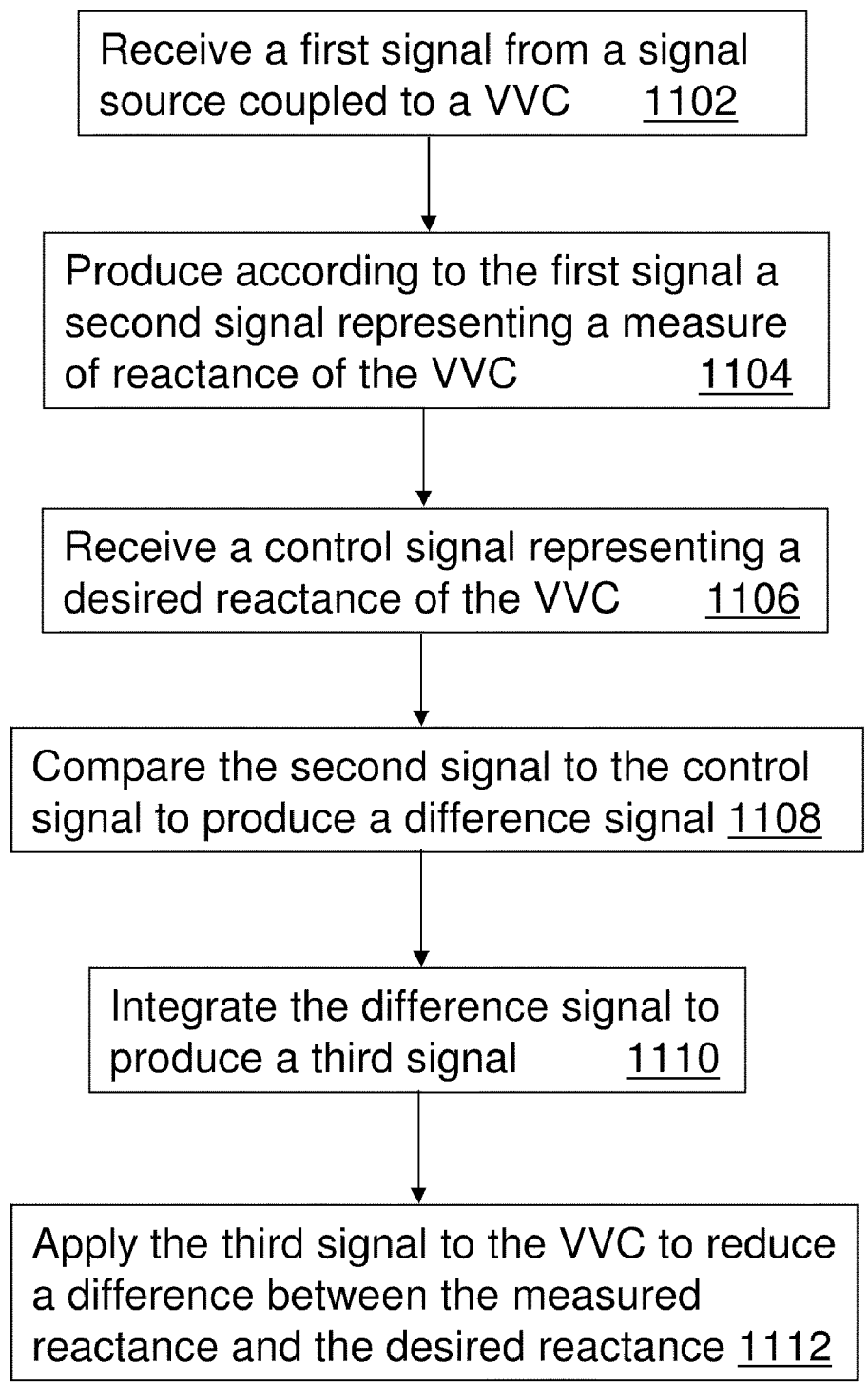
FIG. 11 depicts an illustrative method applied to at least one VVC of FIG. 4.

FIG. 11 depicts an illustrative method 1100 that describes one or more aspects of the present disclosure. Method 1100 can begin with step 1102 in which a first signal can be received from a signal source coupled to a VVC. From the first signal a second signal can be produced in step 1104 which can represent a measure of reactance of the VVC. A control signal representing a desired reactance of the VVC can be received in step 1106 and compared in step 1108 to the second signal to produce a difference signal. The difference signal can be integrated in step 1110 to produce a third signal which can be applied to the VVC to reduce a difference between the measured reactance of the VVC and the desired reactance.

From the foregoing descriptions, it would be evident to an artisan with ordinary skill in the art that the aforementioned embodiments can be modified, reduced, or enhanced without departing from the scope and spirit of the claims described below. For example, the present disclosure can be adapted so that it is applicable to other present or next generation tunable reactive elements which may experience a drift in reactance for the same reasons provided herein, or other undisclosed reasons. Additionally, the present disclosure can be applied to any device in which a tunable reactance element might have use. These undisclosed embodiments are therefore contemplated by the present disclosure.

Figure 12:
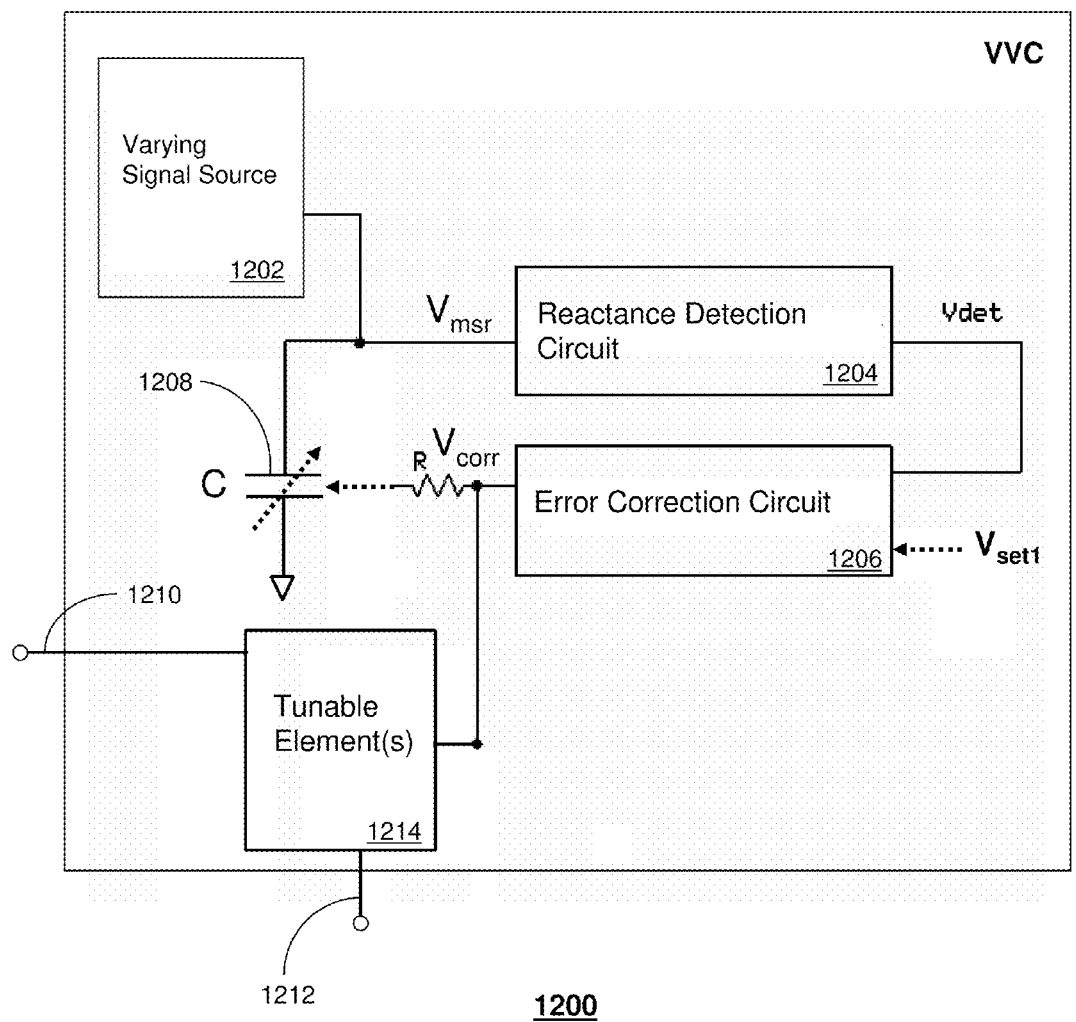
FIG. 12 depicts generalized embodiments of a voltage variable capacitor.

The foregoing embodiments can be generalized in the illustrative embodiments presented by FIG. 12. In this illustration, the signal source 1202 can be a varying signal source of any type (e.g., fixed crystal oscillator, or voltage controlled oscillator as described earlier). The varying signal source can be coupled to a reference reactive element 1208 which can be a fixed reactive element or a tunable reactive element. The fixed reactive element or tunable reactive element can be designed on a single integrated circuit or as discrete components using the same or a similar fabrication process so that their operating properties are similar to those of the reference reactive element 1208. In the case where the reference reactive element 1208 is a fixed reactive element such as a fixed capacitor, drift in capacitance due to temperature can be monitored and corrected, while reverse polarization cannot be readily corrected. However, there may be instances where such a tradeoff is acceptable. In an embodiment where the reference reactive element 1208 is a tunable reactive element, then reverse polarization can also be corrected as described above.

The $V_{msr}$ signal created by the combination of the signal source 1202 and reference reactive element 1208 can be supplied to a reactance detection circuit 1204 (such as those described above in FIGS. 5 and 6) which generates the $V_{det}$ signal representing a measure of the reactance of the reference reactive element 1208. The error correction circuit 1206 can utilize an integration circuit such as described above or a look-up table if the reference reactive element 1208 is a fixed reactive element such as a fixed capacitor. In the case of a fixed reactive element, the look-up table can be established according to the known reactance of the reference reactive element 1208. For example, suppose the known reactance is 2 pico Farads (or 2 pF). With this knowledge, the look-up table can be designed with a number of values which can be used for the correction signal $V_{corr}$ to adjust tunable element(s) 1214 according to the detected drift in reactance from the desired reactance of the reference reactive element 1208, which in this example is 2 pF.

If the tunable element(s) 1214 comprises tunable reactive elements, then the correction signal $V_{corr}$ can represent an analog signal which can be used to adjust the drift detected by the error correction circuit 1206. If the tunable elements 1214 comprises switched reactive elements utilizing MEMS or semiconductor switches, then the correction signal $V_{corr}$ can represent a digital signal which when decoded with common binary decoding logic adds or removes fixed reactive elements to compensate for the detected drift in reactance.

It should be noted that a VVC as described in FIG. 12 can be used in any application. For example, the VVC can be utilized in a tunable matching network such as reference 202 of FIG. 2. Alternatively the VVC of FIG. 12 can be utilized in a tunable filter of any kind for any use which may be affected by drift issues in reactance as described above. These undisclosed embodiments are contemplated by the present disclosure.

Other suitable modifications can be applied to the present disclosure. Accordingly, the reader is directed to the claims for a fuller understanding of the breadth and scope of the present disclosure.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A device, comprising:
    a signal source coupled to a first tunable reactive element to generate a first signal;
    a reactance detection circuit to: detect from the first signal a reactance of the first tunable reactive element, and generate a second signal that represents the reactance; and
    an error correction circuit to: receive a control signal that represents a desired reactance of the first tunable reactive element, detect from a comparison of the control signal to the second signal a drift from the desired reactance, and generate a third signal to adjust the reactance of the first tunable reactive element to achieve the desired reactance.

2. The device of claim 1, wherein the third signal is applied to the first tunable reactive element to achieve the desired reactance.

3. The device of claim 1, wherein the third signal is applied to a second tunable reactive element to achieve the desired reactance.

4. The device of claim 3, wherein the first and second tunable reactive elements have one or more similar operational properties.

5. The device of claim 4, wherein the one or more similar operational properties comprises at least one of a similar temperature to capacitance profile, or a similar residual polarization profile.

6. The device of claim 3, wherein the first and second tunable reactive elements are located in an integrated circuit constructed from a fabrication process that results in the first and second tunable reactive elements having one or more similar operational properties.

7. The device of claim 6, wherein at least one of the signal source, the reactance detection circuit, or the error correction circuit are located in the integrated circuit.

8. The device of claim 3, wherein the second tunable reactive element corresponds to a tunable matching network coupled to an antenna of a communication device.

9. The device of claim 1, wherein each of the first and second tunable reactive elements comprise a voltage variable capacitor (VVC).

10. The device of claim 9, wherein the VVC comprises a tunable dielectric material.

11. The device of claim 10, wherein said tunable dielectric material comprises barium strontium titanate (BST) of any composition.

12. The device of claim 1, wherein the reactance detection circuit comprises an amplitude detector.

13. The device of claim 12, wherein the signal source comprises a fixed frequency oscillator to produce the first signal at a fixed frequency, wherein an amplitude of the first signal is modulated at least in part by a change in reactance of the first tunable reactive element, and wherein the modulated amplitude is detected by the amplitude detector to generate the second signal.

14. The device of claim 1, wherein the reactance detection circuit comprises a frequency modulation discriminator.

15. The device of claim 14, wherein the signal source comprises a variable frequency oscillator, wherein a frequency of the first signal is modulated by the variable frequency oscillator according to at least in part a change in reactance of the first tunable reactive element, and wherein the modulated frequency is detected by the frequency modulation discriminator to generate the second signal.

16. The device of claim 1, wherein the error correction circuit comprises an integrator to generate the third signal to adjust the reactance of the first tunable reactive element.

17. The device of claim 1, wherein the control signal is produced by a control circuit that establishes the desired reactance of the first tunable reactive element.

18. The device of claim 17, wherein the control circuit comprises:
    a Digital to Analog Converter (DAC) to produce an intermediate control signal;
    a power converter to produce an amplification signal; and
    an amplifier to receive the intermediate control signal and the amplification signal to produce the control signal.

19. A tunable matching network, comprising:
    a first tunable reactive element; and
    a second tunable reactive element,
    wherein the first and second tunable reactive elements are tuned to a desired reactance by a control signal and a device operable to adjust a reactance of the first and second tunable reactive elements when the desired reactance is not achieved, wherein the device comprises:

a signal source coupled to the first tunable reactive element that generates a first signal, a reactance detection circuit that receives the first signal and therefrom generates a second signal that represents a reactance of the first tunable reactive element, and an error correction circuit that receives the control signal and the second signal and therefrom generates a third signal that adjusts the reactance of the first tunable reactive element to achieve the desired reactance.

20. The tunable matching network of claim 19, wherein the reactance detection circuit comprises an amplitude detector, wherein the signal source comprises a fixed frequency oscillator to produce the first signal at a fixed frequency, wherein an amplitude of the first signal is modulated at least in part by a change in reactance of the first tunable reactive element, and wherein the modulated amplitude is detected by the amplitude detector to generate the second signal.

21. The tunable matching network of claim 19, wherein the reactance detection circuit comprises a frequency modulation detector, wherein the signal source comprises a variable frequency oscillator, wherein a frequency of the first signal is modulated by the variable frequency oscillator according to at least in part a change in reactance of the first tunable reactive element, and wherein the modulated frequency is detected by the frequency modulation discriminator to generate the second signal.

22. A method, comprising:

receiving a first signal from a signal source coupled to a first tunable reactive element;

producing according to the first signal a second signal representing a measure of reactance of the first tunable reactive element;

receiving a control signal representing a desired reactance of the first tunable reactive element;

utilizing a processing circuit to compare the second signal to the control signal to produce a difference signal;

integrating the difference signal to produce a third signal; and applying the third signal to the first tunable reactive element to reduce a difference between the measured reactance and the desired reactance.

23. The method of claim 22, comprising producing the second signal by applying the first signal to one of an amplitude detector and a frequency discriminator.

24. The method of claim 23, wherein the signal source comprises a fixed frequency oscillator, wherein an amplitude of the first signal is modulated at least in part by a change in reactance of the first tunable reactive element, and wherein the modulated amplitude is detected by the amplitude detector to generate the second signal.

25. The method of claim 23, wherein the signal source comprises a variable frequency oscillator, wherein a frequency of the first signal is modulated by the variable frequency oscillator according to at least in part a change in reactance of the first tunable reactive element, and wherein the modulated frequency is detected by the frequency modulation discriminator to generate the second signal.

26. The method of claim 22, comprising a step to apply the third signal to a second tunable reactive element to reduce a drift in reactance of each of the first and second tunable reactive elements due to at least one of a temperature and a residual polarization of the first and second tunable reactive elements.

27. The method of claim 22, wherein the signal source is coupled to a precision resistor.

28. The method of claim 22, wherein the signal source corresponds to a reference signal source utilized by a communication device.

29. The method of claim 22, comprising retrieving a correction signal from a look-up table, wherein the correction signal is utilized for adjusting a reactance of a tunable network that includes the first tunable reactive element.

30. The method of claim 29, wherein the correction signal is one of a digital correction signal and an analog correction signal.

31. The method of claim 29, wherein the tunable network corresponds to one of a tunable matching network, or a tunable filter.

32. The method of claim 22, wherein the first tunable reactive element correspond to a switched reactive elements controlled by one of one or more microelectromechanical systems switches or one or more semiconductor switches.

* * * * *